United States Patent [19]
Woodward

[11] Patent Number: 6,037,810
[45] Date of Patent: Mar. 14, 2000

[54] ELECTRONIC SYSTEM HAVING A MULTISTAGE LOW NOISE OUTPUT BUFFER SYSTEM

[75] Inventor: Gregory C. Woodward, Austin, Tex.

[73] Assignee: Advanced Mirco Devices, Inc., Sunnyvale, Calif.

[21] Appl. No.: 08/919,126

[22] Filed: Aug. 26, 1997

[51] Int. Cl.[7] .......................... H03K 17/687; H03K 5/13
[52] U.S. Cl. ......................... 327/108; 327/261; 327/384; 326/83
[58] Field of Search ................................. 327/108, 379, 327/380, 261, 384; 326/27, 83

[56] References Cited

U.S. PATENT DOCUMENTS

| | | | |
|---|---|---|---|
| 5,170,073 | 12/1992 | Hahn et al. | 327/108 |
| 5,216,289 | 6/1993 | Hahn et al. | 327/379 |
| 5,248,906 | 9/1993 | Mahmood | 326/80 |
| 5,321,319 | 6/1994 | Mahmood | 326/86 |
| 5,489,867 | 2/1996 | Tamanoi | 327/270 |

OTHER PUBLICATIONS

Technical Manual, Am79C432 ISM PhoX™ Controller for Digital Cordless Telephones, Chapter 1 (Overview), pp. 1–1 through 1–19, and Chapter 2 (Functional Description), pp. 2–1 through 2–37.

*Primary Examiner*—Dinh T. Le
*Attorney, Agent, or Firm*—Skjerven, Morrill, MacPherson, Franklin & Friel, L.L.P.; Kent B. Chambers

[57] ABSTRACT

In one embodiment, a multistage output buffer supplies current to a load by successively turning ON output buffer circuits which transition from an OFF state to approximately a saturated state during approximately mutually exclusive periods of time. Thus, the aggregate dI/dt of the contributed by the output buffer drivers is primarily associated with a single output buffer driver. Additionally, the respective output driver transition periods are controlled by delay stage impedance to reduce dI/dt. The consecutive activation of the output buffer drivers may be achieved by using respective delay stages to control activation of associated, respective output buffer drivers. Each delay stage receives a delayed output control signal from a previous delay stage, except for the first delay stage which receives a control input signal from a signal source. Each delay stage also delays activation of its own output control signal with delay circuit elements such as relatively HIGH impedance IGFETs. The output control signals from each delay stage relatively slowly charge a gate of the associated, respective output buffer driver to activate the output buffer driver and cause a successive delay stage to begin activating the respective output control signal of the successive delay stage. In this manner, each delay stage and, thus, each associated, respective output buffer driver depends on the previous delay stage output control signal to begin the state transition of the respective output buffer driver. Furthermore, the number of delay stages to be activated is programmable to conserve power and further decrease dI/dt induced noise.

14 Claims, 8 Drawing Sheets

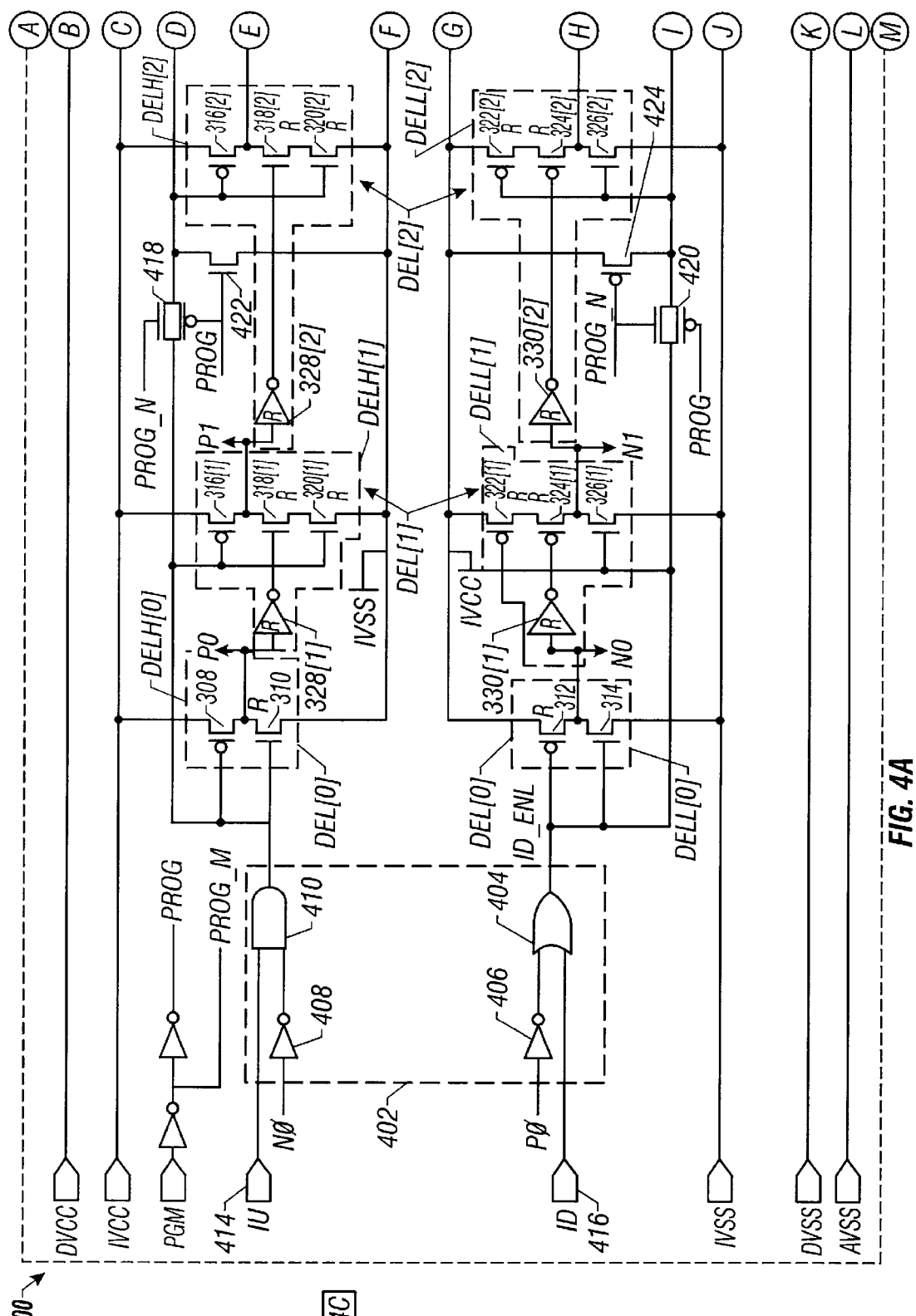

ELECTRONIC SYSTEM HAVING A MULTISTAGE LOW NOISE OUTPUT BUFFER SYSTEM

BACKGROUND OF THE INVENTION

1. Field of the Invention

This invention relates to electronic systems and more particularly relates to multiple output buffer drivers stages.

2. Description of the Related Art

An integrated circuit output buffer circuit typically charges and discharges an output impedance network that includes, for example, integrated circuit package leads and other large and small impedances connected to the leads. Rapid current changes associated with charging and discharging of the impedance network may produce power supply voltage noise when parasitic reactances and reactive loads are driven by the output buffer. This power supply voltage noise is undesirable because, if a large enough voltage swing occurs, it can be interpreted as an input signal state change by loads connected to the leads.

A network formed by the output buffer, a load connected to integrated circuit package leads, and a conductive path between the power supply voltage source and the load can be represented by an RLC equivalent circuit When driving complimentary metal oxide semiconductor (CMOS) circuitry, the inductance, L, is generally due to the inherent parasitic self inductance of the leads and conductive path. The capacitance (C) is generally due to the capacitive load of circuitry connected to the leads, and the resistance, R, is generally the resistance of the conductive path.

As loads are driven to HIGH voltages, e.g., 2–3.3 volts (V), and to LOW voltages, e.g., 0–1 V, by the output buffer, current varies over time at a rate defined by dI/dt, the derivative of output current over time. Power supply voltage noise is a function of dI/dt and the network impedance and can cause unintentional logic level changes in logic devices connected to the leads if the output buffer output voltage amplitude exceeds a logical threshold of the logic device. Power supply voltage noise may be manifested on a line supplying power to the output buffer and other circuits. The power supply line is often distributed around an integrated circuit periphery, and other circuits, such as an input buffer circuit sharing the same power line, may experience voltage instability due to the supply voltage noise. A noisy supply voltage may also cause logic shifting of data driven to a voltage level by other bus drivers sharing the same power line as the output buffer circuit causing the large dI/dt.

Conventionally, attempts have been made to reduce dI/dt by introducing resistance into the current path of a driving transistor. However, this may not sufficiently reduce dI/dt induced noise appearing on supply voltage lines, Vsso and Vcco, especially for coincident switching output buffers. Another attempted solution increases the number of power supply pins to a circuit to distribute current paths and thus reduce aggregated dI/dt. However, the number of supply pins may be constrained by, for example, a need for backwards compatibility or a need to utilize available pins for other purposes.

Accordingly, a need exists for an output buffer that sufficiently reduces dI/dt induced noise, including power supply voltage noise, in all modes of operation

SUMMARY OF THE INVENTION

In one embodiment of the present invention, output buffer drivers of a multistage output buffer driver system transition from an OFF state to an approximately saturated state during approximately mutually exclusive periods of time. The state transition of each of the output buffer drivers causes dI/dt induced noise. However, because the state transitions occur during approximately mutually exclusive periods of time, an aggregate dI/dt during any period of time is substantially attributable to only one output buffer driver. Furthermore, in one embodiment, smaller output buffer drivers are used in initial stages to reduce dI/dt. Additionally, state transition times are regulated by delay circuits which control the output buffer drivers so as to further control dI/dt.

In one embodiment, two banks of multistage delay circuitry and associated output drivers supply current from a power supply having terminals at different voltage potentials and regulate associated output buffer driver state transition times. The respective banks operate similarly with one bank causing associated output buffer drivers to source current to a load and the other bank causing associated output buffer drivers to sink current from a load. A signal source control signal causes one bank delay circuits to substantially simultaneously turn OFF (nonconducting) associated multistage output buffer drivers. Simultaneously, another control signal from the signal source causes a first delay stage to relatively slowly charge transition an output control signal so as to turn ON an associated output buffer driver. The delay stages are "daisy chained" so that the second delay stage responds to the output control signal of the first delay stage by transitioning the second delay stage output control signal, the third delay stage likewise responds to the output control signal of the second delay stage, and so on for X delay stages. Each delay stage includes resistive elements that delay the transition of a respective output control signal for a predetermined period of time when the output control signal of a delay stage is being used to turn an output buffer driver ON (conducting). Each delay stage also includes elements of relatively LOW resistivity that are used to relatively quickly transition a respective output control signal to a state to turn a respective output buffer driver OFF. The delay between respective output control signal transitions which control respective output buffer driver state transitions provides the approximately mutually exclusive output buffer driver transition to saturation periods and provides the LOW dI/dt relative to conventional quick transition, simultaneous turn ON output buffer drivers.

In another embodiment, the number of active stages may be selected by, for example, a programmable register. Thus, the number of conducting output buffer drivers can be limited in accordance with, for example, connected load current requirements, to further limit total dI/dt noise and reduce power consumption of, for example, an electronic communication system such as a mobile telephone. By limiting the dI/dt noise, inadvertent circuit device logic level changes can be reduced or eliminated which, for example, increases the reliability of the electronic system employing the multistage output buffer system.

In another embodiment of the present invention, an electronic system includes a plurality of delay stages, each delay stage having a first control signal input terminal to receive a first input control signal and having a first control signal output terminal to provide a first output control signal in delayed response to receipt of the first input control signal, wherein the first control signal input terminal of each delay stage, except for the first delay stage, is coupled to the first control signal output terminal of another respective delay stage, and the first control signal input terminal of the first delay stage is for receiving a first input control signal from a signal source. The electronic system further includes a plurality of output buffer drivers coupled to a respective delay stage, each output buffer driver having a first control terminal to receive the first output control signal from one of the respective delay stages and having a first output terminal for coupling to a load.

In another embodiment of the present invention, a method includes the steps of receiving an input control signal and providing a first output control signal to a first output buffer driver. The method further includes the steps of providing an ith output control signal to an ith output buffer driver in delayed response to the (i-l)th output control signal, wherein i is an integer ranging from 2 to N, and N is an integer greater than or equal to 2 and repeating the step of providing an ith output control signal to an ith output buffer until an output control signal is provided to each of N output buffer drivers.

BRIEF DESCRIPTION OF THE DRAWINGS

Features appearing in multiple figures with the same reference numeral are the same unless otherwise indicated.

DETAILED DESCRIPTION OF THE PREFERRED EMBODIMENTS

The following description of the invention is intended to be illustrative only and not limiting.

Figure 1:
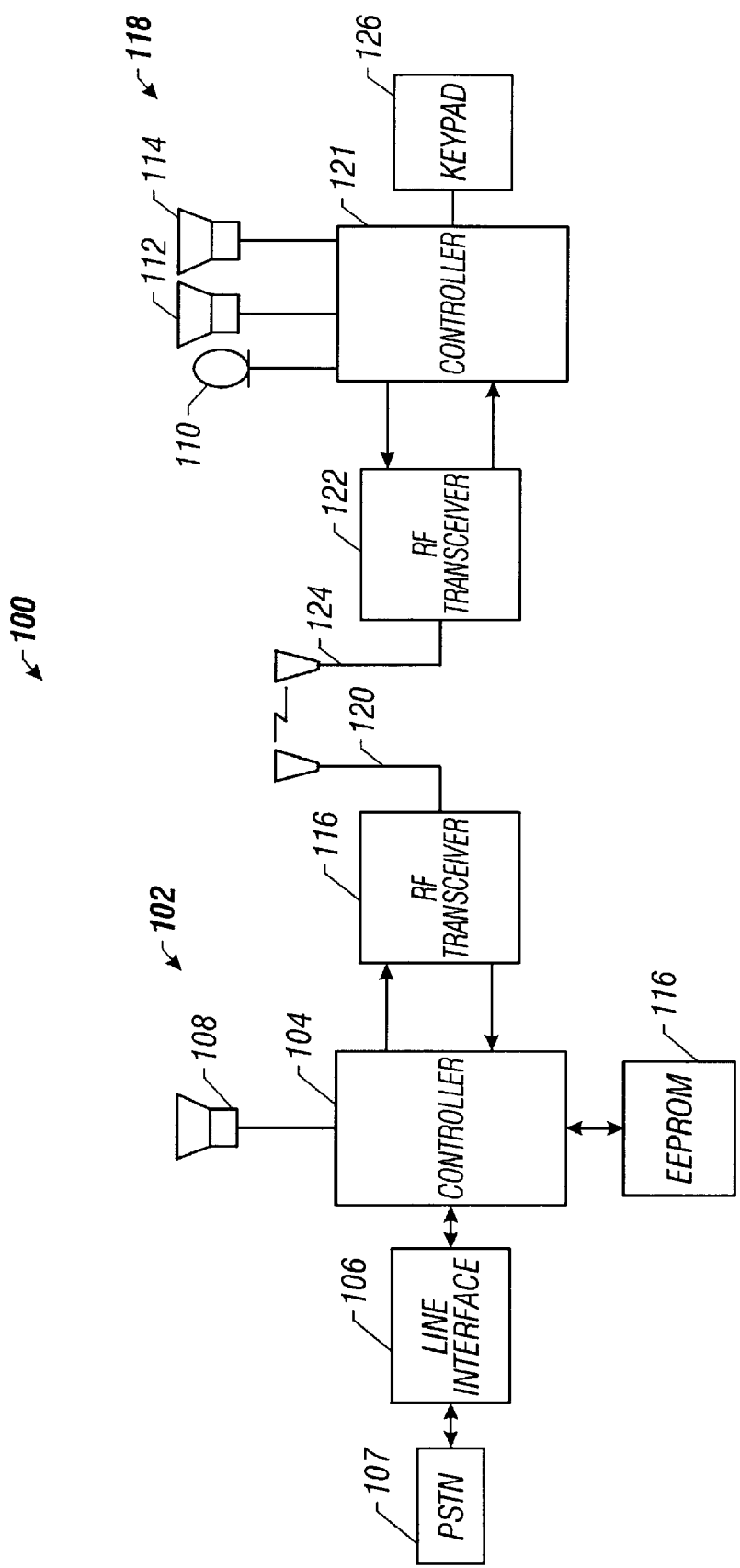
FIG. 1 is an electronic communication system having a portable component and a fixed component.

Many electronic systems including integrated circuit electronic systems are sensitive to power supply voltage noise. One such system is the digital cordless telephone communication system 100 illustrated in FIG. 1. The communication system 100 includes a base station 102 (communication fixed part) configured around controller 104. Controller 104 generally provides baseband functions including processing audio data received and transmitted, protocol control of received and transmitted data, data formatting for transmission, and control of peripheral device functions such as base station ringer 108, microphone 110, speaker 112, and handset ringer 114. Controller 104 may be an integrated circuit incorporating all baseband functions such as the Am79C432 ISM PhoX™ Controller available from Advanced Micro Devices, Inc. (AMD™) of Sunnyvale, Calif. Further information on the Am79C432 ISM PhoX Controller is found in the Am79C432 ISM PhoX™ Controller for Digital Cordless Telephones Technical Manual (Am79C432 ISM PhoX™ Technical Manual) available from AMD™ which is incorporated by reference in its entirety.

A line interface unit 106 provides an interface for data transferred between controller 104 and a public switched telephone network (PSTN) 107, as described, for example, in chapter 4 of the Am79C432 Technical Manual. Various software applications are stored in memory 116 which in one embodiment is an electrically erasable programmable read only memory (EEPROM). RF transceiver 116 is bidirectionally connected to controller 104 and transmits data prepared by controller 104 to handset 118 (communication portable part) via antenna 120. RF transceiver 116 also receives data transmitted from handset 118 and communicates the received data to controller 104. Controller 104 processes the received data and communicates the data to the PSTN 107 via line interface unit 106.

Controller 121 in handset 118 processes and transmits keypad 126 and microphone 110 data via RF transceiver 122 and antenna 124 to base station 102. Controller 121 also receives data from base station 102 via RF transceiver 122 and processes the data for output to speaker 112 and handset ringer 114. Controller 121 may be identical to controller 104.

Figure 2:
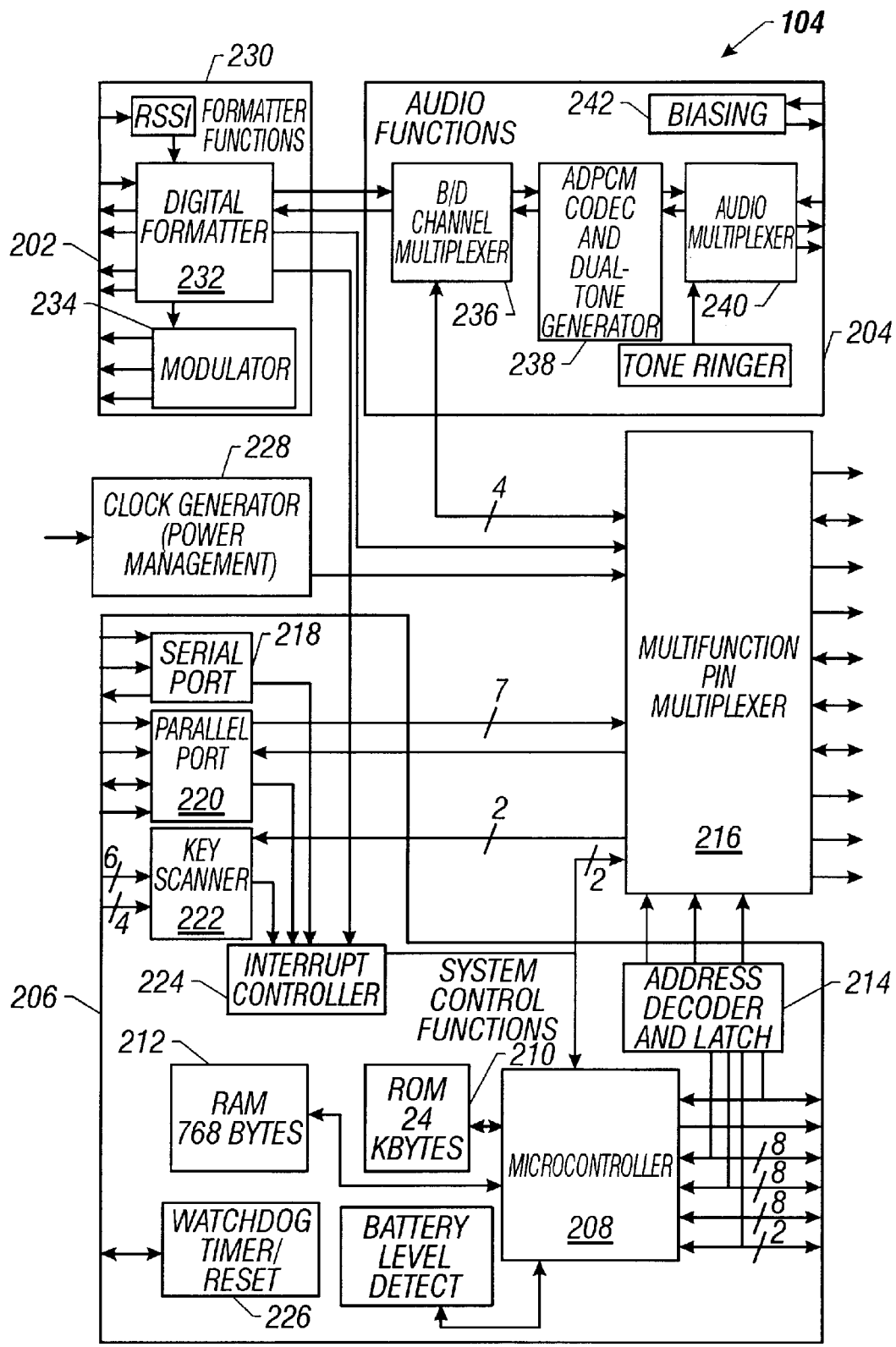
FIG. 2 is controller utilized in the communication system of FIG. 1.

Referring to FIG. 2, controller 104 includes three major functional blocks, a formatter function block 202, an audio function block 204, and a system control function block 206. Power management features are centralized in clock generator block 228. The heart of controller 104 is an 80C32T2 AMD™ 8051-class 8 bit microcontroller 208. Microcontroller 208 drives the embedded digital formatting of formatter function block 202 and configures the audio path and dual-tone multifrequency (DTMF) and ring tone generators of audio function block 204. The microcontroller 208 is connected via a system bus to 24 kbytes of read only memory 210 and to a 768 byte, on-chip static random access memory 212. Microcontroller 208 also services interrupt requests from interrupt controller 224 and coordinates output node selection of multifunction pin multiplexer 216 via address decoder and latch 214. In addition, microcontroller 208 services the various on-chip peripherals, such as the 36-key asynchronous keypad detection key scanner 222, serial port 218, which interfaces to, for example, synthesizers, EEPROMs, or serial LCDs, parallel port 220, and multifunction pin multiplexer 216. The system control function block 206 further includes a watchdog timer and software reset circuit 226.

The formatter function block 202 includes a receive signal strength indicator (RSSI) circuit 230 to determine the signal strength of a received RF signal. A digital formatter 232, connected to the RSSI circuit 230 and to a modulator 234, includes a synchronization channel handler, a D-channel (control channel) handler, a B-channel (32 kbit/s audio channel) handler, and timing recovery. The digital formatter 232 is also connected to multifunction pin multiplexer 216, interrupt controller 224, and B channel and D channel multiplexer 236 of the audio function block 204.

The audio function block 204 further includes an adaptive differential pulse code modulation (ADPCM), compression/decompression, and dual-tone generator circuitry (ADPCM codec dual-tone circuitry) 238 connected between the B channel and D channel multiplexer 236 and audio multiplexer 240. The ADPCM codec dual-tone circuitry 238 performs 32 kbit/s ADPCM conversion in accordance with standard International Consultative Committee for Telegraphy and Telephony (CCITT) recommendation G.721. The B channel and D channel multiplexer 236 configures B-channel and D-channel data paths, making connections between the digital formatter 232 and the ADPCM codec dual-tone circuitry 238. The audio multiplexer 240, for example, allows flexibility in summing and applying gains to analog inputs and outputs. The audio function block 204 further includes biasing circuitry 242.

Chapter 2 of the Am79C432 ISM PhoX™ Technical Manual provides further details regarding the various components of controller 104.

Controller 104 is packaged in, for example, an 84 pin package configuration or a 100 pin configuration. Each output signal path, indicated by arrows pointing toward the periphery of controller 104, includes an output buffer (not shown) to drive output signals on each of the output signal paths. The output buffers are connected to output pads, and the output pads are connected via bond wires to leads on a lead frame which typically extend from the package periphery (not shown).

Figure 3:
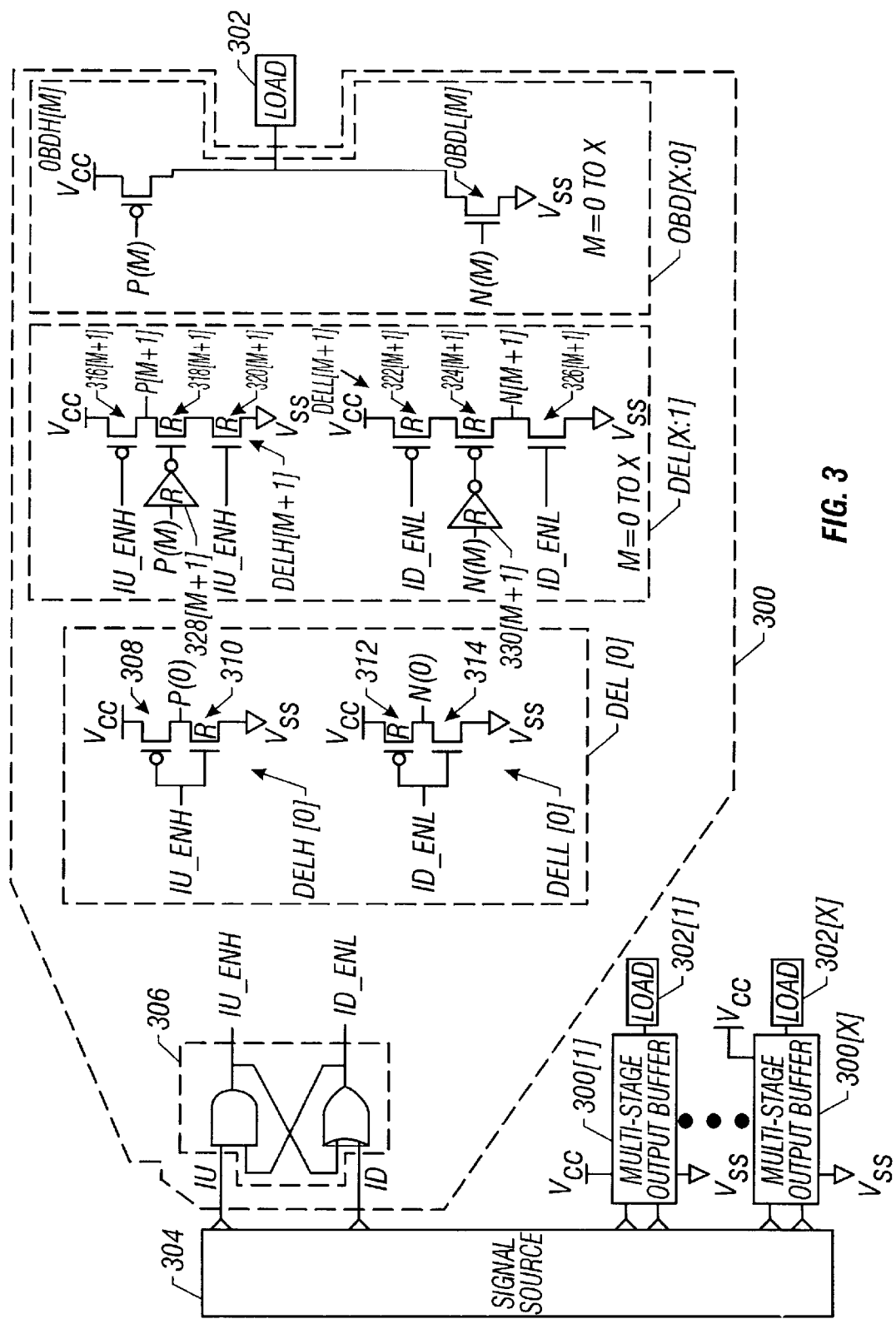
FIG. 3 is a LOW noise, multistage output buffer circuit

Referring to FIG. 3, a multistage LOW noise output buffer system 300 includes X+1 output buffer drivers OBD[X:0], i.e., output buffer drivers OBD[X] through OBD[0], which drive load 302 in response to signal source 304 input control signals IU and ID. Load 302 is, for example, an output pad of controller 104 connected via a lead to at least one CMOS device gate. Typically, other multistage output buffer systems 300[X:1], identical to output buffer system 300 and driving loads 302[X:1], are coupled to the same voltage supply terminal Vcc and voltage reference terminal Vss as multistage LOW noise output buffer system 300. The dI/dt contributions of each of multistage output buffer systems 300[X:0] aggregate to generate voltage noise on supply terminal Vcc or reference terminal Vss. The dI/dt contributions are maximized when each multistage output buffer system 300[X:0] is switching to the same logic level at the same time. The voltage noise is preferably sufficiently minimized to reduce inadvertent logic level switching of the various loads. The multistage LOW noise output buffer system 300 minimizes dI/dt by progressively supplying current to load 302 with X+1 output buffer drivers OBD[X:0]. Each of output buffer drivers OBD:[X:0] turns ON drivers OBDH consecutively to supply enough current to load 302 to cause load 302 to reach a desired logic level within a time typically defined by a predetermined frequency response of multistage LOW noise output buffer system 300.

Signal source 304, which is, for example, a register (not shown) in controller 104 (FIG. 2), supplies input signals IU and ID to respective input terminals of nonoverlap circuit 306. The nonoverlap circuit 306 prevents output signals IU—ENL and output signal ID—ENH from switching logical states at the same time which, as discussed below, prevents LOW impedance paths between power supply voltage terminals Vcc and Vss through delay circuits DEL[X:0].

Output signals IU—ENH and ID—ENL respond to input signals IU and ID according to the truth table in Table 1. The state of load 302 corresponding to input signals IU and ID is also presented in Table 1. Note that to prevent instability, input signals IU and ID are not permitted to change states directly from 01 to 10, where "0" indicates a LOW logic level (0 to +1 V) and "1" indicates a HIGH logic level (+2 to 3.3 V).

TABLE 1

| Input signal IU | Input signal ID | Output signal IU_ENH | Output signal ID_ENL | Load 302 state |
|---|---|---|---|---|
| 0 | 0 | 0 | 0 | 0 |
| 0 | 1 | 0 | 1 | HIGH impedance |
| 1 | 0 | previous state | previous state | previous state |
| 1 | 1 | 1 | 1 | 1 |

Multistage LOW noise output buffer system 300 includes X respective serially connected, daisy-chained delay stages DEL[X:0] which consecutively delay activation of respective output buffer drivers OBD[X:0]. Each of the delay stages DEL[X:0] has two delay circuits. The two delay circuits DELH[0] and DELL[0] of initial delay stage DEL[0] each have a pair of inverter coupled P-channel and N-channel insulated gate field effect transistors (IGFETs) with the N-channel 310 and P-channel 312 IGFETs of delay circuits DELH[0] and DELL[0], respectively, being more resistive than IGFETs 308 and 314, respectively. The delay stage DEL[0] IGFET pairs are each coupled between power supply terminals Vcc (+3 Volts) and Vss (0 V) and respectively drive output signals P[0] and N[0] between about Vcc and Vss. The delay circuits DELH[0] and DELL[0] control the activation and deactivation, i.e., turning ON and OFF, of P-channel IGFET output driver OBDH[0] and N-channel IGFET output driver OBDL[0], respectively, with the respective output signals P[0] and N[0]. Output signals P[0] and N[0] are supplied from the drains of the IGFETs of delay circuits DELH[0] and DELL[0], respectively, and are connected to the gates (control terminals) of output buffer drivers P-channel IGFET OBDH[0] and N-channel IGFET OBDL[0], respectively.

Delay stage DEL[0] responds to signals IU—ENH and ID—ENL, coupled to the gates of delay circuits DELH[0] and DELL[0], respectively, to control the state of output drivers OBDH[0] and OBDL[0] and load 302 in accordance with Table 1. Delay circuit DELH[0] responds to changes in output signal IU—ENH by rapidly transitioning output control signal P[0] to Vcc, through the relatively LOW resistance channel of P-channel transistor 308, when output signal IU—ENH is LOW and relatively slowly discharging output control signal P[0] to Vss, through the relatively HIGH N-channel transistor 310 channel resistance, when output signal IU—ENH transitions from LOW to HIGH. Thus, output driver OBDH[0] rapidly disconnects load 302 from Vcc and relatively slowly turns ON allowing load 302 to relatively slowly charge to Vcc as illustratively shown in FIG. 5B. Delay circuit DELL[0] functions similarly in response to changes in output signal ID—ENL by rapidly coupling output control signal N[0] to Vss through P-channel transistor 312 when output signal ID—ENL is LOW and relatively slowly charging output control signal N[0] to Vcc through N-channel transistor 314 when output signal ID ENL transitions from HIGH to LOW as illustratively shown in FIG. 5C. Thus, output driver OBDL[0] rapidly disconnects load 302 from Vss and relatively slowly charges load 302 to Vss. Delaying charging and discharging of load 302 through output buffer driver stage OBD[0] reduces the associated dI/dt from multistage LOW noise output buffer system 300 and reduces associated voltage noise reflected in Vcc and Vss. The channel resistance of N-channel transistor 310 and P-channel transistor 312 may be tailored to obtain acceptable dI/dt and voltage noise characteristics consonant with a desired switching frequency.

Delaying charging and discharging of load 302 with delay stage DEL[0] is one voltage noise reduction aspect of multistage LOW noise output buffer system 300. Multistage LOW noise output buffer system 300 also reduces dI/dt by driving load 302 with multiple output buffer driver stages OBD[X:0] that sequentially begin charging and discharging load 302 during mutually exclusive instances in time. The timing of charging and discharging load 302 attributable to each of delay stages DEL[X:0] may be customized to obtain the acceptable dI/dt and voltage noise characteristics within the contains of a desired switching frequency.

Delay stage DEL[1] includes delay circuits DELH[1] and DELL[1] which control output drivers OBDH[1] and OBDL[1], respectively, of output buffer driver stage OBD[1].

Delay circuit DELH[1] includes three IGFETs serially connected between Vcc and Vss. Output signal IU—ENH is directly connected to gates of P-channel IGFET 316[1] and N-channel IGFET 320[1]. When output signal IU—ENH is HIGH, transistor 316[1] is OFF and transistor 320[1] is ON. When conducting, transistor 316[1] rapidly raises output control signal P[1] to Vcc which turns output driver OBDH [1] OFF to rapidly disconnect load 302 from Vcc. When turned OFF upon receiving a HIGH output signal IU ENH, transistor 316[1] rapidly decouples output control signal P[1] from Vss. However, to bring output control signal P[1] to Vss, both N-channel transistor 318[1] and transistor 320[1] must be conducting. To turn transistor 318[1] ON, the gate of transistor 318[1] must charge to a voltage which exceeds the threshold voltage of transistor 318[1]. The first delay stage, delay stage DEL[0], supplies the signal P[0] to turn transistor 318[1] ON. A resistive inverter 328[1] inverts output control signal P[0] to provide a control signal to transistor 318[1]. Consequently, output control signal P[0] must be driven LOW, towards Vss, to turn ON transistor 318[1].

As output control signal P[0] relatively slowly decreases towards Vss, as described above, output driver OBDH[0] begins conducting and transistor 318[1] begins conducting shortly thereafter as a result of the inverter 318[1] gate charging delay imposed by resistive inverter 328[1]. With output signal IU—ENH HIGH and transistor 318[1] beginning to conduct, output control signal P[1] begins to decrease towards Vss. The decrease of output control signal P[1] towards Vss lags behind output control signal P[0] due to the delay imposed by resistive inverter 328[1] and the resistive channels and gate to channel capacitances (Cgc) of IGFETs 318[1] and 320[1]. As output control signal P[1] decreases towards Vss, the gate of output driver OBDH[1] follows output control signal P[1], and output driver OBDH [1] begins to turn ON and charge load 302 towards Vcc. The lag time between output signals P[0] and P[1] staggers the turn ON times for output drivers OBDH[0] and OBDH[1 ].

Additional delay circuits DELH[X:2] are identical to delay circuit DELH[1] except that the respective resistances of transistors 318[X:2] and 320[X:2] and resistive inverters 328[X:2] may be tailored to achieve suitable timing of output signals P[X:2], respectively. Output signals P[X−1:1] are coupled to the resistive inverters 328[X:2], respectively, i.e., output control signal P[1] is coupled to inverter 328[2], output control signal P[2] is coupled to inverter 328[3], and so on. Thus, each of output signals P[X:1] lags behind the preceding output signal(s) P[X−1:0]. Additionally, output signals P[X:2] are coupled to gates of output drivers OBDH [X:2], respectively. Thus, output drivers OBDH[X:0] sequentially turn ON, and the lag times between turning ON is dependent upon the timing of output signals P[X:0].

Delay circuits DELL[X:1] function similarly to delay circuits DELH[X:1] with some notable differences described below. Delay circuit DELL[1] also includes three IGFETs serially connected between Vcc and Vss. Output signal ID—ENL from nonoverlap circuit 306 is directly connected to gates of P-channel IGFET 322[1] and N-channel IGFET 326[1]. When output signal ID—ENL is LOW, transistor 322[1] is ON and transistor 326[1] is OFF. The center, P-channel IGFET 324[1] responds to changes in output control signal N[0] from delay circuit DELL[0]. Resistive inverter 330[1] responds to a received output control signal N[0] by providing a delayed, inverted output control signal N[0] to the gate of transistor 324[1]. When output signal ID—ENL is LOW and output control signal N[0] is HIGH, delay circuit DELL[1] relatively slowly raises output control signal N[1] to Vcc through the resistive channels and Cgc's of IGFETs 322[1] and 324[1]. Delay circuit DELL[1] also functionally differs from delay circuit DELH[1] in that when output signal ID—ENL is LOW, delay circuit DELL[1] rapidly brings output control signal N[1] to Vss through IGFET 326[1].

Output signal N[1] charges and discharges the gate (control terminal) of N-channel IGFET output buffer driver OBDL[1] to turn output buffer driver OBDL[1] OFF and ON, respectively. When output buffer driver OBDL[1] is ON, load 302 is discharged to Vss and, when OFF, load 302 is decoupled from Vss. By preferably preventing output signals N[X:0] and P[X:0] from having different states at the same time, the nonoverlap circuit 306 also preferably prevents any current path between Vcc and Vss through the output drivers of output buffer driver stages OBD[X:0].

When conducting, IGFET 326[1] rapidly transitions output control signal N[1] to Vss which turns output driver OBDL[1] OFF to rapidly disconnect load 302 from Vcc. When turned OFF upon receiving a LOW signal ID—ENL, transistor 326[1] rapidly decouples output control signal N[1] from Vss. However, to bring output control signal N[1] to Vss, both N-channel transistor 324[1] and transistor 326[1] must be conducting. To turn ON, the gate of transistor 324[1] must charge to a voltage which exceeds the threshold voltage of transistor 324[1]. The previous delay stage, delay stage DEL[0], supplies the signal N[0] to turn transistor 324[1] ON. A resistive inverter 330[1] inverts output control signal N[0] to provide a control signal to transistor 324[1]. Consequently, output control signal N[0] must be driven HIGH, towards Vcc, to turn ON transistor 324[1]. Thus, as output control signal N[0] increases towards Vcc, output driver OBDL[0] begins conducting and transistor 324[1] begins conducting shortly thereafter as a result of the inverter 324[1] gate charging delay imposed by resistive inverter 330[1]. With output signal ID—ENL LOW and transistor 324[1] beginning to conduct, output control signal N[1] begins to increase towards Vcc. The increase of output control signal N[1] towards Vcc lags behind output control signal N[0] due to the delay imposed by resistive inverter 330[1] and the resistive channels and Cgc's of transistors 324[1] and 326 [1]. As output control signal N[1] increases towards Vcc, the gate of output driver OBDL[1] follows output control signal N[1], and output driver OBDL [1] begins to turn ON and discharge load 302 towards Vss. The lag time between output signals N[0] and N[1] staggers the turn ON times for output drivers OBDL[0] and OBDL [1].

Additional delay circuits DELH[X:2] are identical to delay circuit DELH[1] except that the respective resistances of transistors 324[X:2] and 322[X:2] and resistive inverters 330[X:2] may be tailored to achieve suitable timing of output signals N[X:2], respectively. Output signals N[X−1:1] are coupled to the resistive inverters 330[X:2], respectively, i.e., output control signal N[1] is coupled to inverter 330[2], output control signal N[2] is coupled to inverter 330[3], and so on. Thus, each of output signals N[X:1] lags behind the preceding output signal(s) N[X−1:0]. Additionally, output signals N[X:2] are coupled to gates of output drivers OBDL[X:2], respectively. Thus, output drivers OBDL[X:0] sequentially turn ON, and the lag times between turning ON is dependent upon the timing of output signals N[X:0].

Output buffer driver stages OBD[X:0] may all be identical or the individual size of output drivers OBDH[X:0] and OBDL[X:0] may be tailored so that output buffer driver stages OBD[X:0] supply a predetermined amount of current to load 302.

The aggregate dI/dt of multistage LOW noise output buffer system 300 is the sum of dI/dt contributions by output buffer driver stages OBD[X:0]. As activated output drivers OBDH[X:0] and OBDL[X:0] reach respective steady states, dI/dt attributed to the respective output drivers falls to about zero. The lag time between output signals P[0] and P[1] may be adjusted to achieve suitable timing so that the dI/dt attributed to output driver OBDH[0] substantially declines before output driver OBDH[1] turns ON. Likewise, the lag time between output signals N[0] and N[1] may be adjusted to achieve suitable timing so that the dI/dt attributed to output driver OBDL[0] declines before output driver OBDL[1] turns ON. The lag times between output signals P[X:2] and P[X-1:1], respectively, may also be adjusted to achieve suitable timing so that the dI/dt's attributed to output drivers OBDH[X-1:11] respectively decline before the respective output drivers OBDH[X:2] turn ON. Additionally the lag times between N[X:2] and N[X-1:1], respectively, may also be adjusted to achieve suitable timing so that the dI/dt's attributed to output drivers OBDL[X-1:1] respectively decline before the respective output drivers OBDL[X:2] turn ON. By consecutively delaying activation of output buffer drivers OBD[X:0], during any given time the aggregate dI/dt attributable to multistage LOW noise output buffer system 300 is less than the total dI/dt if all stages of multistage LOW noise output buffer system 300 are simultaneously activated or if a single stage that supplies all drive current is activated. The progressive output driver activation sequence may be timed such that the aggregate dI/dt of all output buffer drivers OBD[X:0] at any given time is primarily or solely attributed to a single one or to a subset of the output buffer drivers OBD[X:0]. Thus, the aggregate dI/dt generated by multistage LOW noise output buffer system 300 falls within an acceptable range.

Figure 4B:
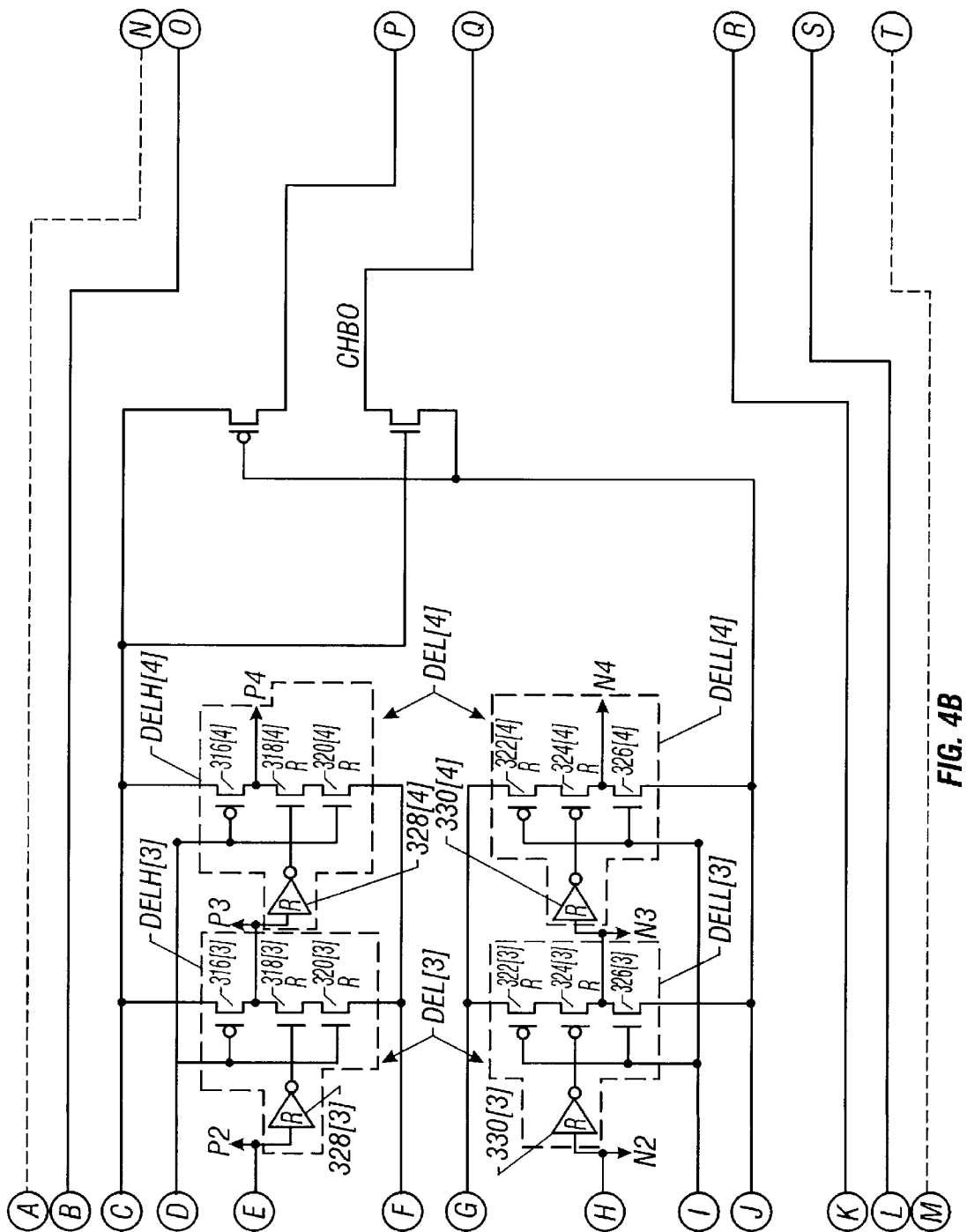
FIG. 4A and FIG. 4B, collectively referred to as FIG. 4, are a programmable embodiment of the multistage output buffer circuit of FIG. 3.

Referring to FIGS. 4A and 4B (collectively referred to as FIG. 4), a programmable CMOS programmable multistage LOW noise output buffer 400 is illustrated. Programmable multistage LOW noise output buffer 400 is an embodiment of multistage LOW noise output buffer system 300 and functions as described above with reference to multistage LOW noise output buffer system 300. Nonoverlap circuits 306 and 402 share the same truth table, Table 1. Nonoverlap circuit 402 includes AND gate 410 which receives input signal IU on one input terminal and receives an inverted output control signal N[0] via inverter 408 on the other input terminal. Nonoverlap circuit 402 further includes OR gate 404 which receives input signal ID on one input terminal and receives an inverted output control signal P[0] via inverter 406 on the other input terminal. Non-overlap circuit 402 obeys the truth table in Table 1.

The multistage LOW noise output buffer 400 includes delay circuits DEL[4:0] which are one embodiment of delay circuits DELH[4:0], respectively, and DELL[4:0], respectively, allow multistage LOW noise output buffer 400 to operate at approximately 12.5 MHz with maximum worst case voltage noise of approximately 0.10 V. The multistage LOW noise output buffer 400 also includes output buffer drivers OBD[4:0] which are one embodiment of output buffer drivers OBDH[4:0] and output buffer drivers OBDL[4:0]. In this embodiment, the IGFETs of delay stages DEL[4:0] and output buffer driver stages OBD[4:0] listed in Table 2 have dimensions that provide the delay and current carrying capacity to drive load 412 at 12.5 MHz.

TABLE 2

| ELEMENT NUMBER | IGFET CHANNEL TYPE | WIDTH (micron) | LENGTH (micron) |
|---|---|---|---|
| 308 | P-channel | 4 | 0.75 |
| 310 | N-channel | 2 | 2 |
| 312 | P-channel | 2 | 2 |
| 314 | N-channel | 1.5 | 0.75 |
| 316[4:1] (each) | P-channel | 4 | 0.75 |
| 318[2:1] (each) | N-channel | 2 | 2.75 |
| 318[3] | N-channel | 2 | 3 |
| 318[4] | N-channel | 2 | 3.25 |
| 320[2:1] (each) | N-channel | 2 | 2.75 |
| 320[3] | N-channel | 2 | 3 |
| 320[4] | N-channel | 2 | 3.25 |
| 322[4:1] (each) | P-channel | 2 | 2.75 |
| 324[4:1] (each) | P-channel | 2 | 2.75 |
| 326[4:1] (each) | N-channel | 1.5 | 0.75 |
| OBDH[0] | P-channel | 30 | 1 |
| OBDH[1] | P-channel | 30.75 | 0.75 |
| OBDH[2] | P-channel | 45 | 0.75 |
| OBDH[4:3] (each) | P-channel | 50 | 0.75 |
| OBDL[0] | N-channel | 15 | 1 |
| OBDL[1] | N-channel | 20 | 1 |
| OBDL[3:2] | N-channel | 25 | 1 |
| OBDL[4] (each) | N-channel | 40 | 1 |

In operation, the multistage LOW noise output buffer 400 receives input signals IU and ID, via respective input terminals 414 and 416, from a signal source such as signal source 304 at respective input terminals of a nonoverlap circuit 402. As shown in Table 1, input signal IU and input signal ID control the output state of pad 412.

Referring to FIGS. 4, 5A, 5B, and 5C, delay circuits DEL[4:0] are connected to power supply voltage rails Ivcc (+3.3 V) and Ivss (0 V). Output buffer drivers OBD[4:0] are connected to power supply voltage rails Dvcc (+3.3 V) and Dvss (0 V). At t0 (5 ns), assuming an initial state at time equal 0 of input signal IU and input signal ID being LOW ("0"), the output voltage at pad 412 is approximately DVss. When input signal IU and input signal ID are asserted HIGH ("1"), output signals ID—ENL and ID—ENH are both asserted HIGH. The N-channel transistors 314 and 326[4:1] of delay circuits DELL[4:0] respond to output signal ID—ENL by rapidly and substantially simultaneously turning ON and by causing control signals N[4:0] to rapidly decrease from HIGH to LOW. The LOW control signals N[4:0] are coupled to the gates of N-channel output buffer drivers OBDL[4:0], respectively, which turn output buffer drivers OBDL[4:0] OFF. As control signals N[4:0] decrease, delay circuits DELH[4:0] sequentially cause signals P[4:0], respectively, to decrease from IVcc to IVss. As output signal IU—ENH transitions to HIGH, P-channel transistors 308 and 316[4:1], having gates to receive output signal IU—ENH, rapidly turn OFF, and N-channel transistors 320[4:1] turn ON. N-channel transistor 310 turns ON in response to output signal IU—ENH, and the resistive channel and Cgc of transistor 310 causes control signal P0 to relatively slowly transition from HIGH to LOW.

Signals P[3:0] are the control signals for delay circuits DELH[4:1], respectively. Inverters 328[4:1] in conjunction with transistors 310 and 318[3:1], respectively, sequentially delay signals P[3:0], respectively, to stagger charging of the gates of transistors 318[4:1], respectively. Transistors 318[4:1] turn ON once control signals P[3:0] respectively charge the gates transistors 318[4:1] to respective threshold voltages, and the resistive channels and Cgc's of transistors 318[4:1] and 320[4:1] respectively delay the transition of control signals P[4:1] from HIGH to LOW. As control signals P[4:0] sequentially transition from HIGH to LOW, the gates of output buffer drivers OBDH[4:0] are respectively sequentially discharged which causes output buffer drivers OBDH[4:0] to sequentially turn ON. The output buffer drivers OBDH[4:0] are sized so that they increasingly supply more current to pad 412.

Figure 5A:
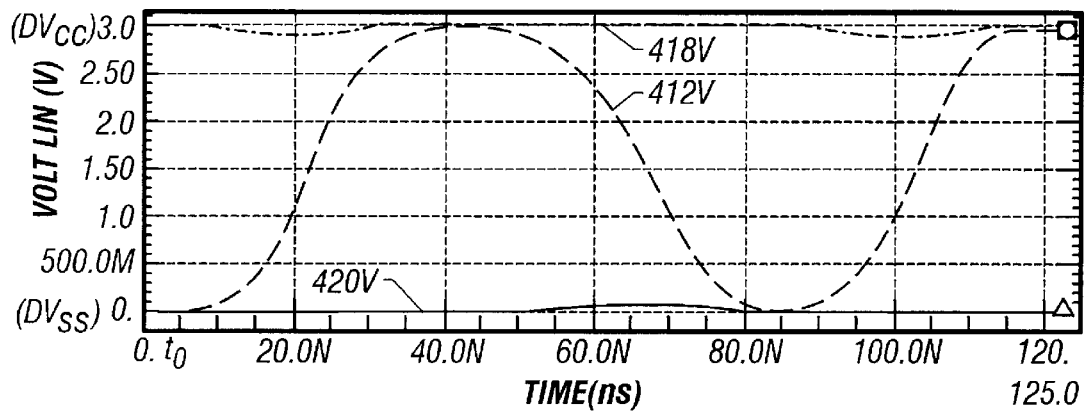
FIGS. 5A through 5C and FIG. 6 are voltage versus time plots of the multistage output buffer circuit of FIG. 4.
Figure 5B:
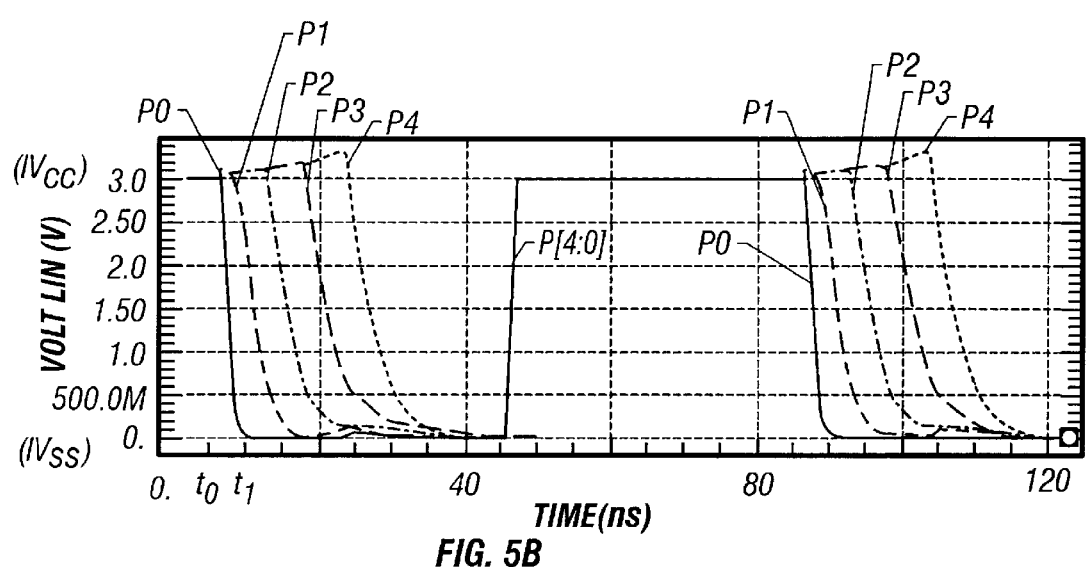

Referring to FIGS. 5A and 5B, as control signals P[4:0] sequentially decrease and output buffer drivers OBDH[4:0] sequentially turn ON, the voltage of pad 412, as represented by voltage curve 412 V, steadily rises to approximately DVcc within a predetermined amount of time, which in this embodiment is approximately 30 ns. The transition of control signals P[3:0] from HIGH to LOW substantially occurs during different periods of time. Accordingly, the dI/dt attributable to each of output buffer drivers OBDH[4:0] is non-zero at approximately different periods of time. Thus, the aggregate dI/dt at any one time is approximately the dI/dt of only one of the output buffer drivers OBDH[4:0].

Referring to FIG. 5A, output buffer drivers OBDH[4:0] draw increasingly more current and generate larger dI/dt's which produce more noise as shown by the increasing drop in voltage DVcc between approximately 7 ns and 20 ns. The total drop of DVcc though is only 0.1 V as a result of the staggered, substantially nonaggregated dI/dt's attributable to respective output buffer drivers OBDH[4:0]. This small voltage drop is generally insufficient to cause any circuit device (not shown) coupled to DVcc or pad 412 to inadvertently change state.

Figure 6:
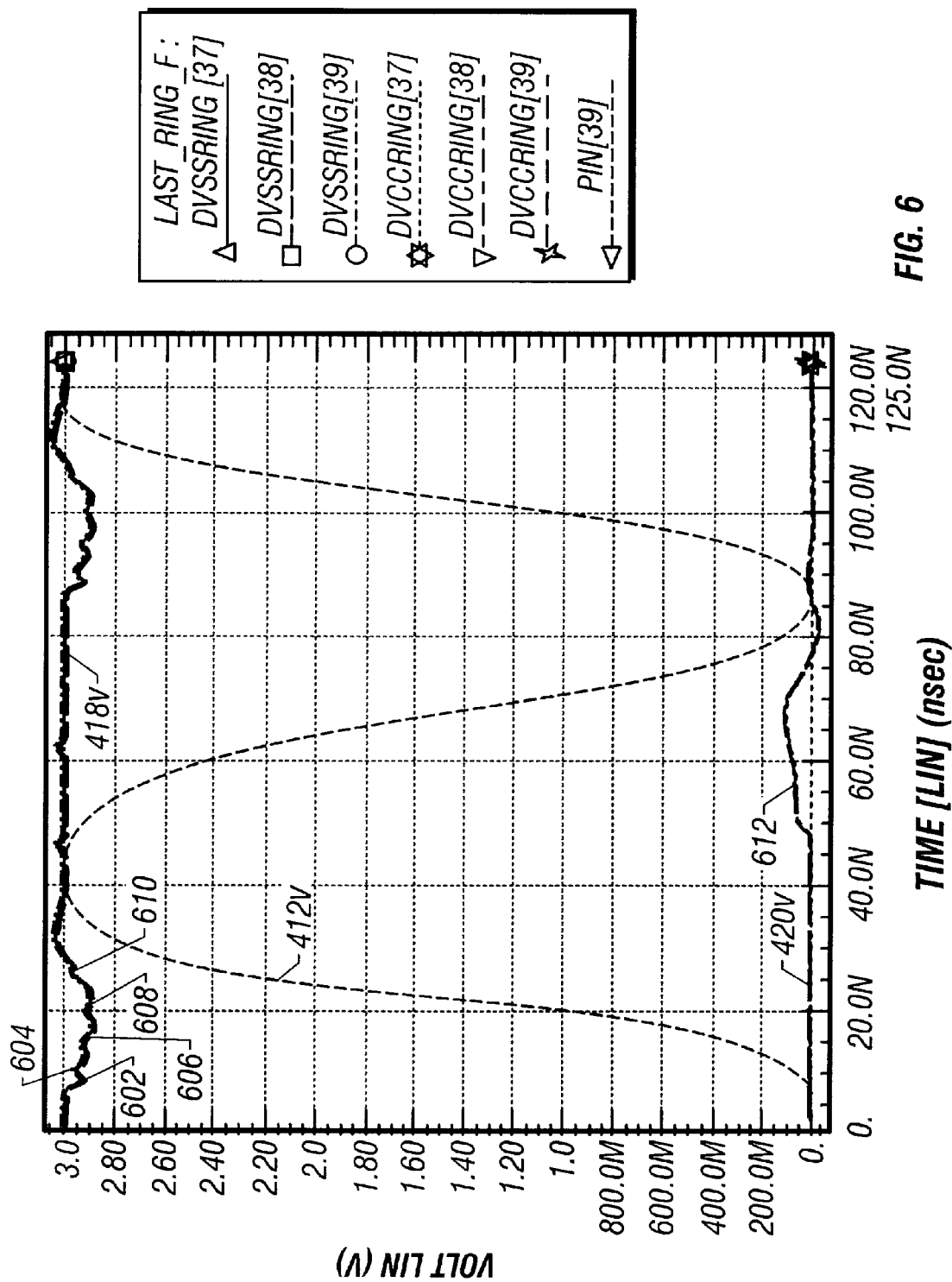

Referring to FIG. 6, an amplified view of FIG. 5A shows that as output signal P[0] transitions toward IVss and exceeds the threshold voltage of output driver OBDH[0], output driver OBDH[0] switches ON. The maximum dI/dt change in DVcc voltage plot 418 v induced by output driver OBDH[0] is about 0.06 V and occurs at point 602 on the DVcc voltage plot 418 v with time equal to about 8 ns. As output signal P[0] reaches about IVcc, dI/dt attributable to output driver OBDH[0] decreases, and, thus, DVcc begins to recover toward 3.0 V. At point 604, output signal P[1l] sufficiently turns output driver OBDH[1] ON and dI/dt increases so that DVcc begins to decrease again. As output driver OBDH[1] is approximately saturated, dI/dt decreases, and DVcc begins to recover. This trend continues as shown by the downward slopes at points 606, 608, and 610 of DVcc attributable to output buffer drivers OBDH[4:2], respectively.

Figure 4C:
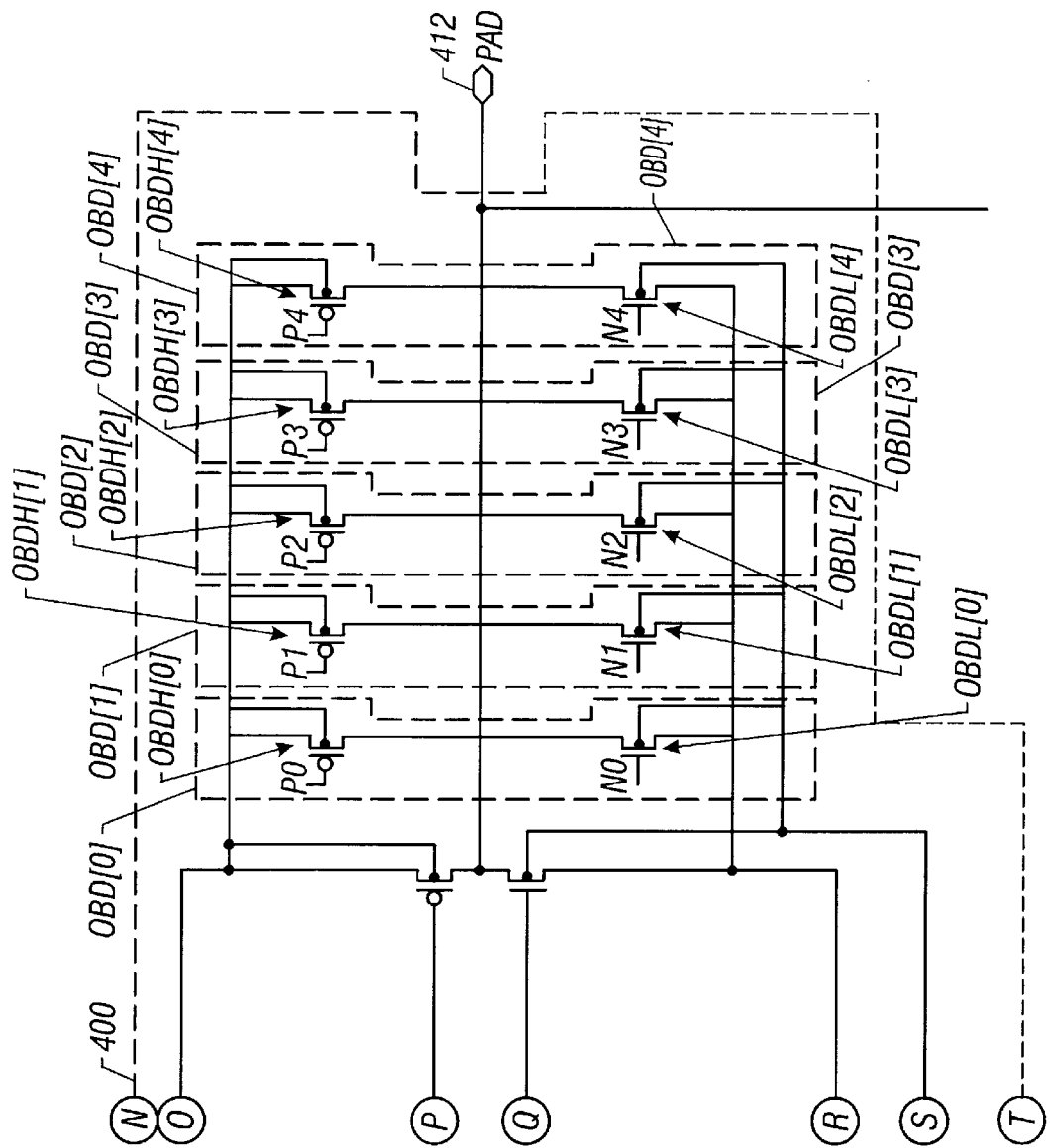

Referring to FIG. 4, to transition pad 412 to DVss without exceeding a predetermined dI/dt induced noise voltage, input signal IU and input signal ID are asserted LOW. When input signal IU and input signal ID are asserted HIGH, output signals ID—ENL and ID—ENH are both asserted LOW. The P-channel transistors 308 and 316[4:1] of delay circuits DELL[4:0] respond to output signal IU—ENL and cause control signals P[4:0] to rapidly increase from IVss to IVcc. The HIGH control signals P[4:0] are coupled to the gates of P-channel output buffer drivers OBDH[4:0], respectively, which turn output buffer drivers OBDH[4:0] OFF. As control signals P[4:0] begin increasing, delay circuits DELL[4:0] sequentially cause signals N[4:0], respectively, to increase from IVss to IVcc. As output signal IU—ENL transitions to LOW, N-channel transistors 314 and 326[4:1], having gates to receive output signal IU—ENL, rapidly turn OFF, and P-channel transistors 322[4:1] turn ON. P-channel transistor 312 turns ON, and the resistive channel of transistor 312 causes control signal NO to relatively slowly transition from LOW to HIGH.

Signals N[3:0] are the control signals for delay circuits DELL[4:1], respectively. Inverters 330[4:1] in conjunction with transistors 314 and 324[3:1], respectively, sequentially delay signals N[3:01], respectively, to stagger charging of the gates of transistors 324[4:1], respectively. Transistors 324[4:1] turn ON once control signals N[3:0] respectively charge the gates transistors 324[4:1] to respective threshold voltages, and the resistive channels and Cgc's of transistors 324[4:1] and 322[4:1] respectively delay the transition of control signals N[4:1] from HIGH to LOW. As control signals N[4:0] sequentially transition from LOW to HIGH, the gates of output buffer drivers OBDL[4:01] are respectively sequentially charged which causes output buffer drivers OBDL[4:0] to sequentially turn ON. The output buffer drivers OBDL[4:0] are sized so that they increasingly supply more current to pad 412.

Figure 5C:
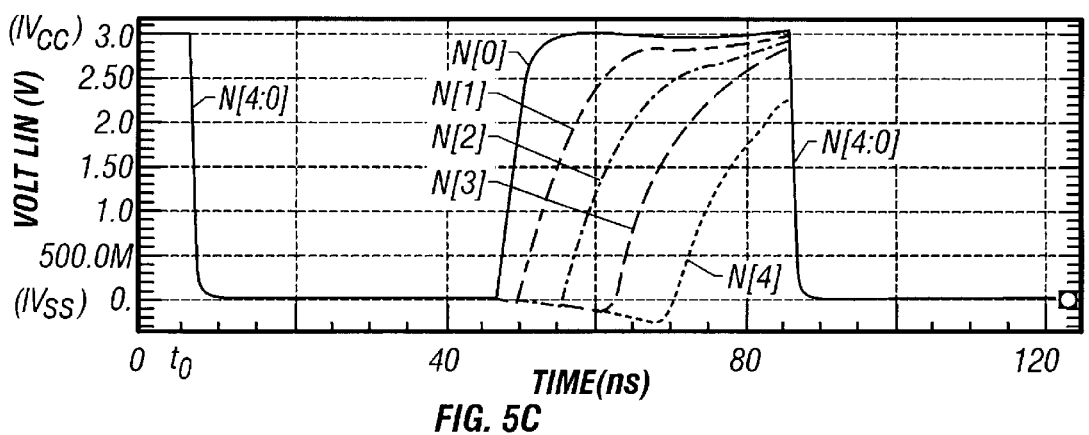

Referring to FIGS. 5A and 5C, as control signals N[4:0] sequentially increase and output buffer drivers OBDL[4:0] sequentially turn ON, the voltage of pad 412 as represented by voltage curve 412 V steadily falls within a predetermined amount of time. Referring to FIG. 5C, the transition of control signals P[3:0] from HIGH to LOW substantially occurs during different periods of time. Accordingly, the dI/dt attributable to each of output buffer drivers OBDH[4:0] is non-zero at approximately different periods of time. Thus, the aggregate dI/dt at any one time is approximately the dI/dt of only one of the output buffer drivers OBDH[4:0].

Referring to FIG. 5A, output buffer drivers OBDL[4:01 supply increasingly more current and generate larger dI/dt's which produce more noise as shown by the increasing drop in voltage DVss 420 V between approximately 48 ns and 80 ns. The total drop of DVss though is only 0.1 V as a result of the staggered, substantially nonaggregated dI/dt's attributable to respective output buffer drivers OBDL[4:0].

Referring to FIG. 6, as output signal N[0] transitions toward IVcc and exceeds the threshold voltage of output driver OBDL[0], output driver OBDL[0] switches ON. The maximum dI/dt change in DVss voltage plot 420 v induced by output driver OBDL[0] is about 0.06 V and occurs at point 612 on the DVcc voltage plot 420 v with time equal to about 50 ns. As output signal N[0] reaches about IVss, dI/dt attributable to output driver OBDL[0] decreases. DVss increases slightly at control signal N[1] increases and output buffer driver OBDL[1] turns ON. As control signal N[0] reaches approximately IVcc, control signal N[1] begins transitioning from IVss to IVcc, thus, turning output buffer driver OBDL[1] ON. This trend continues to sequentially turn ON output buffer drivers OBDL[4:2]. Note that control signals N[4:1] have a flatter rise (smaller dV/dt) relative to control signals P[4:1], and, consequently, dI/dt attributable to respective output buffer drivers OBDH[4:1] is correspondingly less. However, control signals N[4:1] have slightly more positive slope overlap during their respective rises from IVss to IVcc relative to any positive slope overlap between the transitions of control signals P[4:0] from IVcc to IVss. Any overlapping positive slope transitions of control signals N[4:1] contribute to an aggregate dI/dt in programmable multistage LOW noise output buffer 400. However, the flatter rise of control signals N[4:1] and smaller individual dI/dt contributions, relative to control signals P[4:1], maintains the aggregate dI/dt below approximately 0.06 V. The maximum deviation of DVss is only about 0.10 V.

Referring to FIG. 3, the number of delay stages [X:0] and output buffer driver stages OBD[X:0] used to drive load 302 in multistage LOW noise output buffer system 300 may in one embodiment be selectable. For example, respective switches may be activated (conductive) and deactivated (nonconductive), in response to a programmable signal, to prevent and permit, respectively, enablement of a predetermined number of delay stages DEL[X:1].

Referring to FIG. 4, programmable multistage LOW noise output buffer 400 includes CMOS pass gate 418 which is interposed between delay circuit DELH[1] and subsequent delay circuits DELH[4:2] to disable delay circuits DELH[4:2] and, thus, also disable output buffer drivers OBDH[4:2]. The N-channel transistor portion of pass gate 418 responds to control signal PROG—N, and the P-channel transistor portion of pass gate 418 responds to complementary control signal PROG. Control signals PROG and PROG—N may be the output signals of a programmable register (not shown).

When control signal PROG is HIGH and complimentary control signal PROG—N is LOW, pass gate 418 allows output signal IU—ENH to be coupled to the gates of transistors 316[4:2] and 320[4:2] and control conductivity. However, when load 302 is, for example, small and output buffer drivers OBDH[1:0] are sufficient to drive load 302 between logic states, smaller dI/dt induced voltage noise is desired, or less power consumption is desired, control signals PROG and PROG—N are set HIGH and LOW, respectively, to isolate delay circuits DELH[4:2] from output signal IU—ENH. To ensure that delay circuits DELH[4:2] and, thus, output buffer drivers OBDH[4:2] are disabled when control signal PROG is HIGH, N-channel MOS transistor 422 connects the gates and sources of N-channel transistors 320[4:2] to IVss to prevent them from conducting. When nonconductive, transistors 320[4:2] prevent control signals P[4:2] from discharging to IVss and thereby turning output buffer drivers OBDH[4:2] ON. Transistor 422 also connects the gates of transistors 316[4:2] to IVss, and, with the sources of transistors 316[4:2] connected to IVcc, control signals P[4:2] are all charged HIGH. The HIGH state of control signals P[4:2] applied to the gates of P-channel output buffer drivers OBDH[4:2] ensures that output buffer drivers OBDH[4:2] are nonconductive and supply no current to pad 412. Consequently, output buffer drivers OBDH[4:2] do not contribute any current changes dI/dt to programmable multistage LOW noise output buffer 400 when control signals PROG and PROG—N are HIGH and LOW, respectively.

CMOS pass gate 420 operates similarly to pass gate 418 to allow output signal IU—ENL to be coupled to the gates of transistors 322[4:2] and 326[4:2] and control conductivity when control signal PROG is LOW and complimentary control signal PROG—N is HIGH. When control signals PROG and PROG—N are HIGH and LOW, respectively, pass gate 420 becomes nonconductive and isolates delay circuits DELL[4:2] from output signal IU—ENL. Furthermore, a LOW PROG—N control signal connected to a gate of P-channel MOS transistor 424 turns transistor 424 ON and connects IVcc to gates of N-channel transistors 326[4:2]. Thus, with IVss connected to the sources of transistors 326[4:2], control signals N[4:2] are discharged to approximately IVss which ensures that N-channel output buffer drivers OBDL[4:2] remain OFF while PROG—N is LOW. Additionally, a LOW PROG—N control signal at the P-channel MOS transistor 424 gate connects the gates and sources of P-channel transistors 322[4:2] to IVcc so that transistors 322[4:2] are nonconductive. While transistors 322[4:2] are nonconductive, control signals N[4:2] will not charge to IVcc. Consequently, output buffer drivers OBDH[4:2] also do not contribute any current changes dI/dt to programmable multistage LOW noise output buffer 400 when control signals PROG and PROG—N are HIGH and LOW, respectively.

In other embodiments pass gates 418 and 420 may be interposed between different series of delay stages to select the number of output buffer drivers OBDH and OBDL, respectively, to be activated and deactivated. Furthermore, in other embodiments additional pass gates may be interposed between delay stages to increase the available choices of output buffer drivers OBDH and OBDL to activate and deactivate. In other embodiments, other types of switches, delay elements, and programming devices may be used. Additionally, pass gates may be used to program a number of output buffer drivers for activation and deactivation by blocking and unblocking, respectively, common or respective control signals without the incorporation of any delay stages or with delay stages being used with only a subset of output buffer drivers.

It will be understood that the embodiments and variations of the embodiments described herein are well-suited for use in an integrated circuit chip, as well as an electronic system having a microprocessor, a memory, and a system bus.

While the invention has been described with respect to the embodiments and variations set forth above, these embodiments and variations are illustrative and the invention is not to be considered limited in scope to these embodiments and variations. For example, other circuit devices may be used to generate delays so that output buffer drivers sequentially turn ON and quickly, substantially simultaneously turn OFF. Accordingly, various other embodiments and modifications and improvements not described herein may be within the spirit and scope of the present invention, as defined by the following claims.

What is claimed is:

1. An electronic system comprising:
   a plurality of delay stages, each delay stage having a first control signal input terminal to receive a respective first input control signal and having a first control signal output terminal to provide a first output control signal in a delayed response to receipt of the respective first input control signal, wherein the first control signal input terminal of each delay stage, except for a first delay stage, is coupled to the first control signal output terminal of another respective one of the plurality of delay stages, and the first control signal input terminal of the first delay stage is for receiving the first input control signal from a signal source; and
   a plurality of output buffer drivers each coupled to a respective one of the delay stages, each output buffer driver having a first control terminal to receive the first output control signal from the respective one of the delay stages and having a first output terminal for coupling to a load;
   wherein each delay stage further includes a second control signal input terminal to receive a respective second input control signal and having a second control signal output terminal to provide a second output control signal in a delayed response to receipt of the respective second input control signal, wherein the second control signal input terminal of each delay stage, except for the first delay stage, is coupled to the second control signal output terminal of another respective one of the plurality of delay stages, and the second control signal input terminal of the first delay stage is for receiving the second input control signal from the signal source; and
   wherein each of the plurality of output buffer drivers further includes a second control terminal to receive the second output control signal from a respective one of the plurality of delay stages and having a second output terminal for coupling to the load.

2. The electronic system of claim 1 wherein the first and second input control signals from the signal source are nonoverlapping, and each of the plurality of output buffer drivers further include a first voltage terminal to couple the load to a first voltage source in response to the respective first input control signal from the respective one of the plurality of delay stages and include a second voltage terminal to couple the load to a second voltage source in response to the respective second input control signal from the respective one of the plurality of delay stages.

3. The electronic system of claim 2 wherein the delayed response to receipt of the respective first input control signals by respective delay stages is of a sufficient delay to allow the output buffer drivers to transition from an OFF state to at least approximately a voltage level of the first voltage source during mutually exclusive periods of time, and the delayed response to receipt of the respective second input control signals by respective delay stages is of a sufficient delay to allow the output buffer drivers to transition from an OFF state to at least approximately a voltage level of the second voltage source during mutually exclusive periods of time.

4. The electronic system of claim 1 wherein the delayed response to receipt of the respective first input control signals by respective delay stages is of a sufficient delay to allow the output buffer drivers to transition from an OFF state to at least approximately a saturated state during mutually exclusive periods of time.

5. The electronic system of claim 1 wherein the delayed response to receipt of the respective first input control signals by respective delay stages is of a sufficient delay so that an aggregate dI/dt contributed by the output buffer drivers during any period of time is less than a predetermined threshold value.

6. The electronic system of claim 5 wherein the predetermined threshold value is such to produce a corresponding voltage noise of 0.1 Volt at the output terminals coupled to the load.

7. The electronic system of claim 1 wherein the electronic system is an electronic communication system further comprising:
the plurality of delay stages and the plurality of output buffer drivers contained within a controller of a communication handset.

8. The electronic system of claim 1 wherein the first and second input control signals from the signal source are nonoverlapping.

9. An apparatus comprising:
a first plurality of delay stages, each delay stage having first and second delay circuits, wherein the first delay circuits each include:
an enablement terminal coupled to a first control signal terminal of a signal source;
an output control signal terminal;
except of the first delay stage, an input control signal terminal coupled to an output control signal terminal of a respective first delay circuit; and
delay circuitry coupled between the input control signal terminal and the output control signal terminal; and
wherein the second delay circuits each include:
an enablement terminal coupled to a second control signal terminal of a signal source;
an output control signal terminal;
except of the first delay stage, an input control signal terminal coupled to an output control signal terminal of a respective second delay circuit; and
delay circuitry coupled between the input control signal terminal and the output control signal terminal; and a plurality of output buffer driver stages, each output buffer driver stage having first and second output driver circuits, wherein the first output driver circuits each include:
a first current terminal coupled to a first voltage supply source;
a control terminal coupled to a respective one of the first delay circuit output control signal terminals; and
a second current terminal coupled to a load; and
wherein the second output driver circuits each include:
a first current terminal coupled to a second voltage supply source;
a control terminal coupled to a respective one of the second delay circuit output control signal terminals; and
a second current terminal coupled to the load.

10. The apparatus of claim 9 wherein the first and second delay circuits of the first delay stage each comprise:
a P-channel IGFET coupled in series with an N-channel IGFET having gates coupled together to comprise the enablement terminal and having drains coupled together to comprise the output control signal terminal; and
wherein the first delay circuits of the remaining delay stages each comprise:
an inverter having an input terminal to comprise the input control signal terminal and a P-channel IGFET coupled in series with first and second series coupled N-channel IGFETs, wherein the gates of the P-channel IGFET and the second N-channel IGFET are coupled together to comprise the enablement terminal, the gate of the first N-channel is coupled to an output terminal of the inverter, and the drains of the P-channel IGFET and the first N-channel IGFET are coupled together to comprise the output control signal terminal; and
wherein the second delay circuits of the remaining delay stages each comprise:
an inverter having an input terminal to comprise the input control signal terminal and an N-channel IGFET coupled in series with first and second series coupled P-channel IGFETs, wherein the gates of the N-channel IGFET and the second P-channel IGFET are coupled together to comprise the enablement terminal, the gate of the first P-channel is coupled to an output terminal of the inverter, and the drains of the N-channel IGFET and the first P-channel IGFET are coupled together to comprise the output control signal terminal.

11. The apparatus of claim 9 wherein each of the first output buffer driver circuits comprise a P-channel IGFET, and a gate of the P-channel IGFET is the control terminal, a source of the P-channel IGFET is the first current terminal, and a drain of the P-channel IGFET is the second current terminal; and
wherein each of the second output buffer driver circuits comprise an N-channel IGFET, and a gate of the N-channel IGFET is the control terminal, a source of the N-channel IGFET is the first current terminal, and a drain of the N-channel IGFET is the second current terminal.

12. The apparatus of claim 9 further comprising:
a nonoverlap circuit having a first input terminal coupled to the signal source first control signal terminal, a second input terminal coupled to the signal source second control signal terminal, a first output terminal coupled to the enablement terminals of each of the first delay circuit, and a second output terminal coupled to the enablement terminals of each of the second delay circuits.

13. The apparatus of claim 9 further comprising:
a first switch having current terminals coupled between enablement terminals of an ith first delay circuit and an (i-1)th first delay circuit, wherein i is an integer, the first switch further having a control terminal coupled to a programmable circuit output terminal; and a second switch having current terminals coupled between enablement terminals of an ith second delay circuit and an (i-1)th second delay circuit, the first switch further having a control terminal coupled to the programmable circuit output terminal.

14. The apparatus of claim 9 wherein the apparatus is a communication system having a base station that includes the plurality of delay stages and output buffer driver stages.

* * * * *